(12) United States Patent
Kashiwazaki et al.

(10) Patent No.: US 12,007,666 B2
(45) Date of Patent: Jun. 11, 2024

(54) WAVELENGTH CONVERSION ELEMENT AND METHOD FOR PRODUCING SAME

(71) Applicant: Nippon Telegraph and Telephone Corporation, Tokyo (JP)

(72) Inventors: Takahiro Kashiwazaki, Musashino (JP); Takeshi Umeki, Musashino (JP); Ryoichi Kasahara, Musashino (JP); Osamu Tadanaga, Musashino (JP); Koji Embutsu, Musashino (JP); Takushi Kazama, Musashino (JP)

(73) Assignee: NIPPON TELEGRAPH AND TELEPHONE CORPORATION, Tokyo (JP)

( * ) Notice: Subject to any disclaimer, the term of this patent is extended or adjusted under 35 U.S.C. 154(b) by 568 days.

(21) Appl. No.: 17/283,466

(22) PCT Filed: Oct. 8, 2019

(86) PCT No.: PCT/JP2019/039663
§ 371 (c)(1),
(2) Date: Apr. 7, 2021

(87) PCT Pub. No.: WO2020/080195
PCT Pub. Date: Apr. 23, 2020

(65) Prior Publication Data
US 2022/0011647 A1    Jan. 13, 2022

(30) Foreign Application Priority Data
Oct. 15, 2018    (JP) .................................. 2018-194588

(51) Int. Cl.
*G02F 1/377*    (2006.01)
*C30B 29/30*    (2006.01)
(Continued)

(52) U.S. Cl.
CPC .............. *G02F 1/377* (2013.01); *C30B 29/30* (2013.01); *C30B 31/22* (2013.01);
(Continued)

(58) Field of Classification Search
CPC ...................................................... G02F 1/3558
See application file for complete search history.

(56) References Cited

U.S. PATENT DOCUMENTS 5,374,564 A     12/1994  Bruel
5,400,172 A  *   3/1995  Khanarian ............ G02F 1/3617
                                                          359/326
(Continued)

FOREIGN PATENT DOCUMENTS

JP    H09-304800 A    11/1997
JP    3 753 236 B2    12/2005
(Continued)

OTHER PUBLICATIONS

Keisuke Tanaka et al., *Fabrication of Domain Inverted Ridge Waveguide in Ion-Sliced LiNbO₃ for Wavelength Conversion Devices*, 20th Microoptics Conference (MOC'15), 2015, pp. 1-2.
(Continued)

*Primary Examiner* — Rhonda S Peace
(74) *Attorney, Agent, or Firm* — Workman Nydegger

(57) ABSTRACT

A wavelength conversion element manufacturing method capable of realizing, in a wavelength conversion element having a structure in which a thin film substrate having a periodic polarization inversion structure and a support substrate are laminated, highly efficient wavelength conversion by confining light in a cross-sectional area smaller than in the known art. The manufacturing method includes steps of forming a periodic polarization inversion structure on a first substrate made of a second-order nonlinear optical crystal and forming a damage layer in the first substrate by implant-
(Continued)

ing ions from one substrate surface to obtain a first substrate for bonding, directly bonding a second substrate having a bonding surface having a smaller refractive index than the first substrate to the one substrate surface of the first substrate at the bonding surface, and peeling the first substrate directly bonded to the second substrate being the support substrate with the damage layer as a boundary to remove a part of the first substrate.

13 Claims, 7 Drawing Sheets

(51) Int. Cl.
    *C30B 31/22*     (2006.01)
    *G02B 6/293*     (2006.01)
    *G02F 1/355*     (2006.01)
    *G02F 1/39*     (2006.01)

(52) U.S. Cl.
    CPC ....... *G02B 6/29394* (2013.01); *G02F 1/3558* (2013.01); *G02F 1/3775* (2013.01); *G02F 1/39* (2013.01)

(56) References Cited

U.S. PATENT DOCUMENTS

| | | | |
|---|---|---|---|
| 8,932,686 | B2* | 1/2015 | Hayakawa ........... H10N 30/072 427/523 |
| 2008/0165565 | A1 | 7/2008 | Gunter et al. |
| 2010/0088868 | A1* | 4/2010 | Kando ................. H10N 30/05 29/25.35 |
| 2012/0081772 | A1 | 4/2012 | Okazaki et al. |
| 2015/0098672 | A1 | 4/2015 | Yamaguchi et al. |
| 2019/0007022 | A1 | 1/2019 | Goto et al. |
| 2022/0011647 | A1* | 1/2022 | Kashiwazaki .......... G02F 1/377 |

FOREIGN PATENT DOCUMENTS

| | | |
|---|---|---|
| JP | 2012-78443 A | 4/2012 |
| JP | 2015-75568 A | 4/2015 |
| WO | 2018/180827 A1 | 10/2018 |

OTHER PUBLICATIONS

Mathias Prost et al., *A Compact Thin-Film Lithium Niobate Platform with Arrayed Waveguide Gratings and MMIs*, OFC 2018, 2018, pp. 1-3.

* cited by examiner

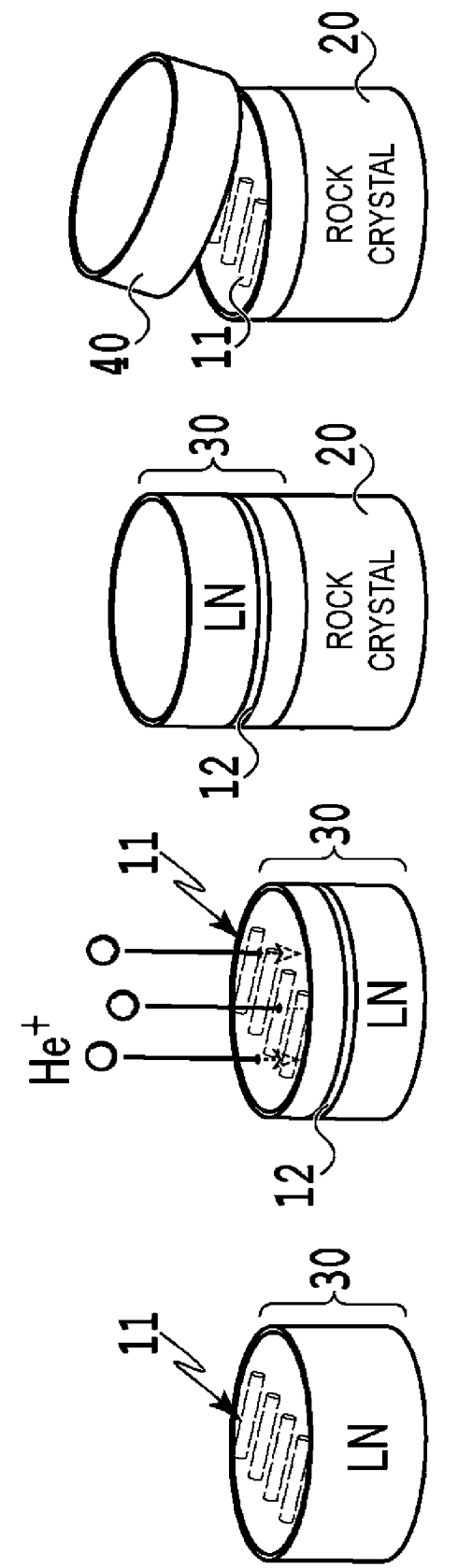

WAVELENGTH CONVERSION ELEMENT AND METHOD FOR PRODUCING SAME

TECHNICAL FIELD

The present invention relates to an optical element using a nonlinear optical effect, specifically relates to a wavelength conversion element employed in an optical communication system and optical signal processing, and relates also to a method of manufacturing the wavelength conversion element.

BACKGROUND ART

Expectations for Nonlinear Optics & Basic Effects of Nonlinear Optics

An optical application technology employing nonlinear optical effects is expected to be useful in new optical communication fields and quantum information processing fields using light. Wavelength conversion is known as a basic effect among nonlinear optical effects. In such wavelength conversion, light incident on a nonlinear optical medium can be converted into light having another frequency. The wavelength conversion is widely known as technology for producing light in a wavelength range in which oscillation by a laser alone is difficult, by using this characteristic. In particular, a waveguide including a periodic polarization inversion structure and employing lithium niobate ($LiNbO_3$) that is a second-order nonlinear material and has a large nonlinear constant, is already incorporated into commercially available light sources because such a waveguide has a highly efficient nonlinear optical effect.

In a second-order nonlinear optical effect, a case in which the following (Equation 1) is satisfied in a wavelength conversion in which light of wavelengths $\lambda_1$ and $\lambda_2$ is input to generate light of a new wavelength $\lambda_3$ is referred to as a sum frequency generation (SFG).

$$1/\lambda_3 = 1/\lambda_1 + 1/\lambda_2 \quad \text{(Equation 1)}$$

In particular, if $\lambda_1 = \lambda_2$, (Equation 1) is modified to obtain the following (Equation 2).

$$\lambda_3 = \lambda_1/2 \quad \text{(Equation 2)}$$

A wavelength conversion satisfying (Equation 2) is referred to as a second harmonic generation (SHG).

Furthermore, a wavelength conversion satisfying the following (Equation 3) is referred to as a difference frequency generation (DFG).

$$1/\lambda_3 = 1/\lambda_1 - 1/\lambda_2 \quad \text{(Equation 3)}$$

Furthermore, there is an optical parametric effect in which only $\lambda_1$ is input, and $\lambda_2$ and $\lambda_3$ are generated to satisfy (Equation 3). In particular, SHG and SFG newly generate, from input light, light having a short wavelength, that is, light having high energy, and are often utilized for generating light in a visible light range, for example.

In order to efficiently make the second-order nonlinear optical effects of SHG and SFG, it is required that a phase mismatch amount of three interacting wavelengths is zero. Thus, it is possible to achieve a quasi-phase mismatch amount of zero by periodically inverting the polarization of a second-order nonlinear optical material. When the inversion period in this case is $\Lambda$, it is only required to set $\Lambda$ so to satisfy the following (Equation 4) for the wavelengths $\lambda_1$, $\lambda_2$, and $\lambda_3$ in the sum frequency generation represented in (Equation 1).

$$n_3/\lambda_3 - n_2/\lambda_2 - n_1/\lambda_1 - 1/\Lambda = 0 \quad \text{(Equation 4)}$$

Here, $n_1$ is the refractive index at the wavelength $\lambda_1$, $n_2$ is the refractive index at the wavelength $\lambda_2$, and $n_3$ is the refractive index at the wavelength $\lambda_3$.

In addition to such a periodic polarization inversion structure, highly efficient wavelength conversion is achieved by forming a waveguide. The nonlinear optical effect increases its effect as the overlapping density of light causing nonlinear interaction is higher. It can thus be said that highly efficient wavelength conversion can be achieved if a waveguide structure capable of confining light in a small cross-sectional area is employed.

CITATION LIST

Patent Literature

PTL 1: JP 3753236 B1
PTL 2: U.S. Pat. No. 5,374,564

Non Patent Literature

NPL 1: "Process for the production of thin semiconductor material films" written by Bruel, Michel, published 20 Dec. 1994

NPL 2: Keisuke Tanaka and Toshiaki Suhara "FABRICATION OF DOMAIN INVERTED RIDGE WAVEGUIDE IN IONSLICED LiNbO3 FOR WAVELENGTH CONVERSION DEVICES" 20th Microoptics Conference (MOC' 15), Fukuoka, Japan, Oct. 25-28, 2015

NPL 3: Mathias Prostl, Guangyao Liul, and S. J. Ben Yoo "A Compact Thin-Film Lithium Niobate Platform with Arrayed Waveguide Gratings and MMIs" OFC 2018

SUMMARY OF THE INVENTION

Technical Problem

Known Manufacturing Method

In the known art, in order to manufacture a wavelength conversion element including a thin film substrate, a waveguide substrate is bonded on a support substrate, and then the waveguide substrate is formed into a thin film by polishing (PTL 1). Unfortunately, with this method, it is difficult to obtain an ultrathin film thickness of 1 micron or less, for example while ensuring in-plane uniformity, and also, most of the bonded substrate is scraped off by the polishing, which is not desirable in terms of cost.

Recent Smart Cut Technology

A thin film substrate acquisition technology (Smart cut (trademark) technology) through ion implantation of SOITECH (trademark) is known (NPL 1) as a method of obtaining a thin film substrate using a method other than polishing. In this method, accelerated ions are implanted from the substrate surface under a constant ion dose amount and a constant accelerating voltage to produce a damage layer at a constant depth from the substrate surface. When heat is applied to this substrate, peeling occurs with the damage layer as boundary. An application of this principle is "Smart cut technology" which is a fundamental technology supporting silicon photonics.

In this method, a flat substrate surface can be obtained by polishing the peeled surface in a last step.

Thin Film LN Using Smart Cut Technology

In recent years, there is an increase in manufacturers which apply this thin film substrate acquisition technology through ion implantation to lithium niobate or tantalum niobate, which is a second-order nonlinear optical crystal, to manufacture and sell lithium niobate (LN) and lithium tantalate (LT) substrates formed into thin films. FIG. 1 is a diagram illustrating a process for manufacturing a commercially available thin film LN composite substrate. As illustrated in FIG. 1, He ions are implanted from one side of an LN substrate 300 to form an ion-implanted layer 101 near a surface of the LN substrate 300 (FIG. 1(a)), and a side of the ion-implanted layer 101 of the LN substrate 300 is attached to a support substrate 200 in which an $SiO_2$ layer 201 and an Si/LN layer 202 are laminated (FIG. 1(b)). A part 400 of the LN substrate 300 is peeled along the ion-implanted layer 101 with leaving a thin film 100 (FIG. 1(c)) to obtain a thin film LN composite substrate 500 (FIG. 1(d)).

However, these substrates are not yet subjected to a polarization inversion process.

Generation of Quasi-Phase Matching in Thin Film LN

It is considered to generate quasi-phase matching (QPM) in the thin film LN formed into a thin film by the "smart cut technology". The quasi-phase matching is achieved by forming a periodic polarization inversion structure in a second-order nonlinear optical crystal. However, the support substrate is already bonded to the substrate formed into a thin film by the "smart cut technology" as described above, and thus, it is very difficult to make the polarization inversion structure therein afterwards. In a z-cut substrate cut so that only an axis (z-axis) with a different refractive index runs along a direction perpendicular to the substrate surface, it is necessary to produce a metal layer below a bonding layer of the substrate in advance and apply an electric field between a top surface of the substrate and the metal layer, but the patterning accuracy in this method is poor (NPL 2). Furthermore, it is necessary to prepare a lower substrate including the metal layer, and thus, the number of processes increases.

On the other hand, in x-cut and y-cut substrates including, in the plane, the z-axis where the refractive index changes, the polarization direction can be modulated by depositing an electrode only on the substrate surface and applying an electric field. However, if future integration is considered, the z-cut substrate has advantages over the x-cut substrate and the y-cut substrate. This is because, if a waveguide is formed on an x-cut or y-cut substrate, the characteristics originating from the refractive index differ depending on the traveling direction of the waveguide. If the characteristics are different, there is a problem in that it is difficult to form a functional element such as a ring resonator or an AWG, and if a bent waveguide is formed, for example, the polarization easily rotates. On the other hand, if a waveguide is formed on a z-cut substrate, the waveguide is isotropic within the plane, which is suitable for integration to easily manufacture a functional element.

Utility of QPM Generation in z-Cut Substrate

In recent years, thin film LN technology not only aims at increase of the second-order nonlinear optical effect and the Pockels effect by forming small cores, but also attracts attention in terms of integration easiness with other functional elements (NPL 3).

In such integrated devices, it is easy to imagine that optical waveguides are formed vertically and horizontally in the substrate plane. In this case, in an x-cut substrate and a y-cut substrate, birefringence due to dissymmetry in the crystal is a problem. That is, the z-axis direction of the crystal substrate is included in the plane, and thus, the refractive index changes depending on the direction of the formed waveguide. As a result, the optical elements to be integrated are limited, and the difficulty of the design is greatly increased.

Furthermore, the nonlinear optical coefficient is large for light including an electric field component parallel to the z-axis direction of the substrate, and thus, a waveguide parallel to the z-axis direction of the substrate cannot have a sufficiently large electric field component in the z-axis direction and it is not possible to maximize the nonlinear optical effect. In general, crystals exhibiting a second-order nonlinear optical effect always have crystal dissymmetry, and thus, the above problem is not inherent to LN.

For the above reasons, it can be said that it is desirable to employ a z-cut substrate in aiming at integration. However, also for z-cut LN substrates, an effective technique for obtaining a thin film substrate having a periodic polarization inversion structure that realizes high quality QPM is not provided so far.

The present invention is made in view of such problems in the known art, and an object of the present invention is to provide, in a wavelength conversion element having a structure in which a thin film substrate having a periodic polarization inversion structure and a support substrate are laminated, a wavelength conversion element capable of realizing highly efficient wavelength conversion by confining light in a cross-sectional area smaller than in the known art, and a method of manufacturing the wavelength conversion element.

Means for Solving the Problem

In order to solve the above-described problems, a wavelength conversion element according to one embodiment includes an ultrathin thin film substrate having a periodic polarization inversion structure, and a support substrate being directly bonded to the thin film substrate and having a refractive index at a surface directly bonded to the thin film substrate that is smaller than a refractive index of the thin film substrate.

A method of manufacturing a wavelength conversion element according to another embodiment includes a bonding substrate formation step of forming a periodic polarization inversion structure on a first substrate made of a second-order nonlinear optical crystal and forming a damage layer in the first substrate by implanting ions from one substrate surface to obtain a first substrate for bonding, a bonding step of directly bonding a second substrate having a bonding surface having a smaller refractive index than a refractive index of the first substrate to the one substrate surface of the first substrate at the bonding surface, and a substrate peeling step of peeling the first substrate directly bonded to the second substrate being a support substrate with the damage layer as a boundary to remove a part of the first substrate to obtain a wavelength conversion element in which an ultrathin thin film substrate is directly bonded onto the support substrate.

BRIEF DESCRIPTION OF DRAWINGS

FIGS. 4(a)-4(d) are diagrams for describing steps.

FIGS. 6(a)-6(c) are diagrams for describing an electric field application procedure.

DESCRIPTION OF EMBODIMENTS

Hereinafter, embodiments of the present disclosure will be described in detail.

Figure 1:
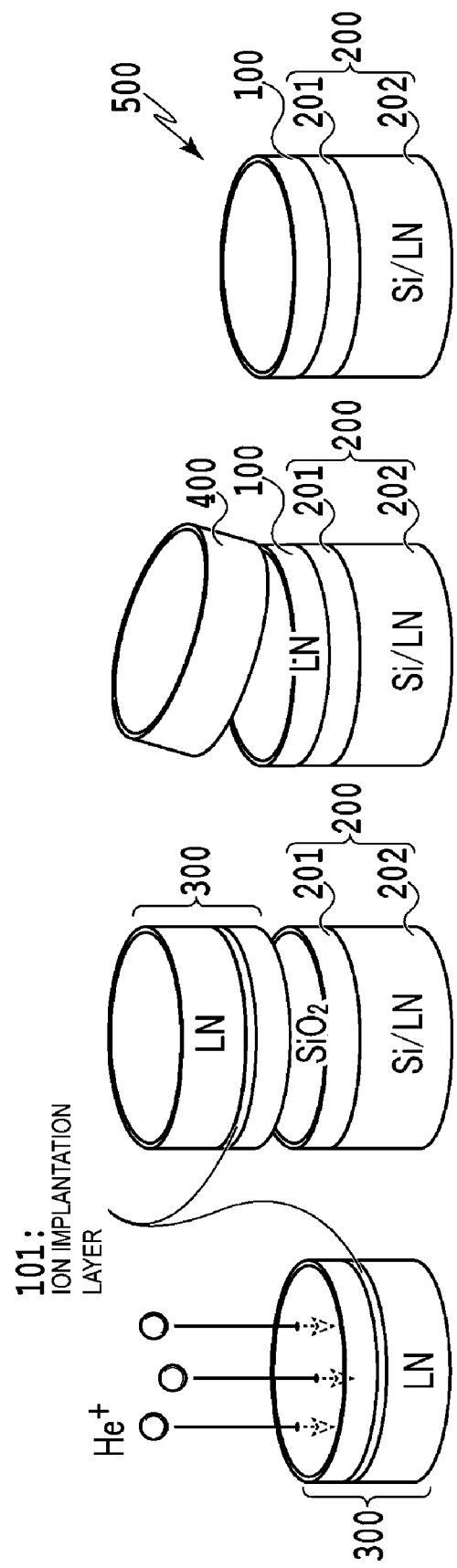
FIGS. 1(a)-1(d) are diagrams illustrating a process for manufacturing a commercially available thin film LN composite substrate.
Figure 2:
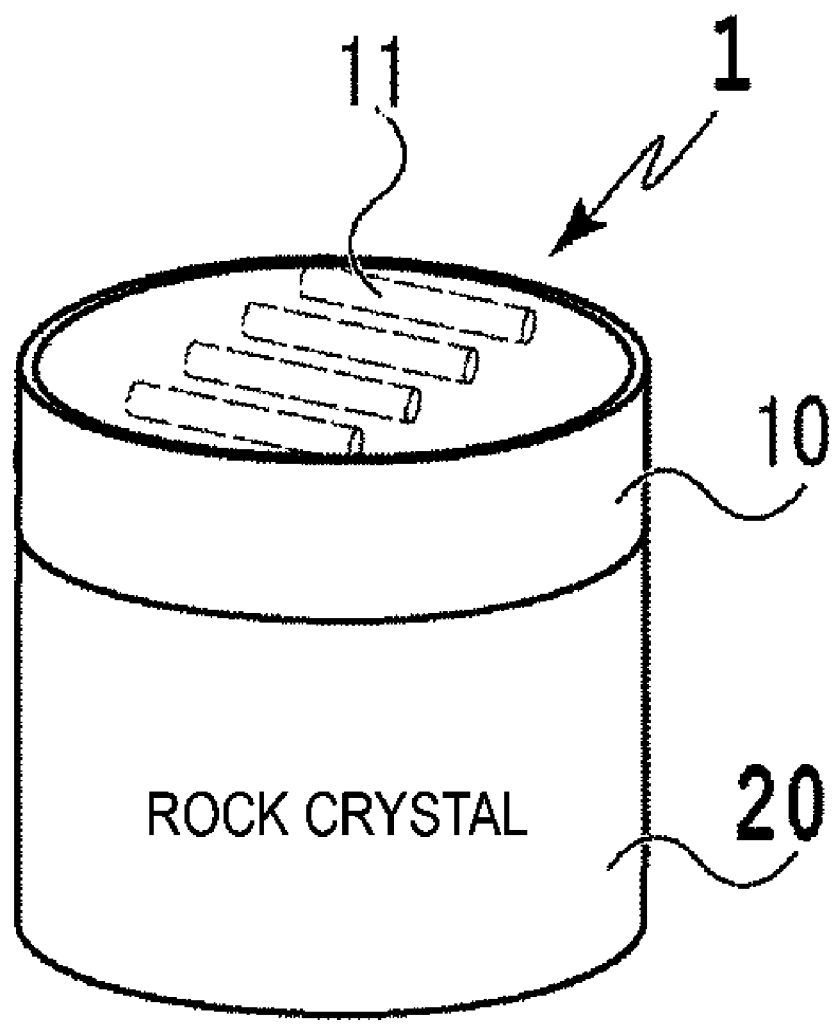
FIG. 2 is a schematic configuration diagram illustrating a wavelength conversion element according to the present embodiment.

FIG. 2 is a schematic configuration diagram illustrating a wavelength conversion element according to the present embodiment. As illustrated in FIG. 2, a wavelength conversion element 1 described in the present embodiment includes an ultrathin thin film substrate 10 having a periodic polarization inversion structure 11 and a support substrate 20 that is directly bonded to the thin film substrate 10 and has a refractive index at a surface directly bonded to the thin film substrate 10 that is smaller than a refractive index of the thin film substrate 10.

As used herein, "ultrathin" refers to a thickness sufficiently smaller than a thickness of a thin film substrate in a known wavelength conversion element having a structure in which a thin film substrate having a periodic polarization inversion structure and a support substrate are laminated, and refers to a thickness of approximately 1 µm or less, for example. In known wavelength conversion elements, thin film substrates having a periodic polarization inversion structure are formed into thin films by polishing, and thus, the obtained thickness is inevitably about 5 µm, for example.

As used herein, "directly bonded" refers to direct bonding of two substrates without a metal layer or a buffer layer therebetween, and also includes a bonding procedure using an adhesive for bonding the two substrates.

The thin film substrate 10 functions as an optical waveguide and includes the periodic polarization inversion structure 11 in a waveguide direction of the thin film substrate 10. A second-order nonlinear optical crystal having a second-order nonlinear optical effect such as lithium niobate or tantalum niobate, for example, can be employed for the thin film substrate 10.

The thin film substrate 10 may be a unilamellar substrate, or may be formed by laminating a plurality of the thin film substrates 10. In this case, a period of the polarization inversion structure 11 may be identical or may be different among the plurality of the thin film substrates 10.

The support substrate 20 supports the thin film substrate 10, and may include a substrate having a smaller refractive index than the thin film substrate 10, or a composite substrate configured such that the refractive index at a surface directly bonded to the thin film substrate 10 is smaller than the refractive index of the thin film substrate 10. The support substrate 20 may be a semiconductor substrate or a metal substrate. The support substrate 20 of the wavelength conversion element according to the present embodiment provides a higher degree of freedom in design than a known support substrate.

In the wavelength conversion element 1 of the present embodiment, the support substrate 20 having a smaller refractive index than the thin film substrate 10 is directly bonded to the ultrathin thin film substrate 10 having the periodic polarization inversion structure 11 serving as the optical waveguide, and thus, it is possible to prevent occurrence of optical loss in guided light while confining light in a smaller cross-sectional area than in the known art.

In the known art, it is also possible to form a structure in which an ultrathin thin film substrate is laminated on a support substrate, by using "smart cut technology". However, in attempting to obtain a wavelength conversion element by using a known thin film LN composite substrate having a thin film LN formed into a thin film by the "smart cut technology", it is necessary to apply a strong electric field to generate a polarization inversion structure on the thin film substrate. This strong electric field damages the support substrate, and thus, it is necessary to provide a metal layer for electromagnetic shielding between the thin film substrate and the support substrate to protect the support substrate from the strong electric field. If the metal layer is between the thin film substrate and the support substrate, metal is present in a path through which light passes, and thus, light loss occurs. It is conceivable to provide a buffer layer to prevent light loss due to the metal layer, however, this is not realistic because the thickness of the entire element increases and also the number of processes increases.

The wavelength conversion element according to the present embodiment is obtained by producing a composite substrate through a process in which a periodic polarization inversion structure is initially formed, a substrate on which a damage layer is formed for smart cut by ion implantation is used as a first substrate, and after the first substrate is directly bonded to a second substrate serving as the support substrate, the first substrate is formed into an ultrathin thin film substrate as a result of being peeled in the damage layer.

Figure 3:
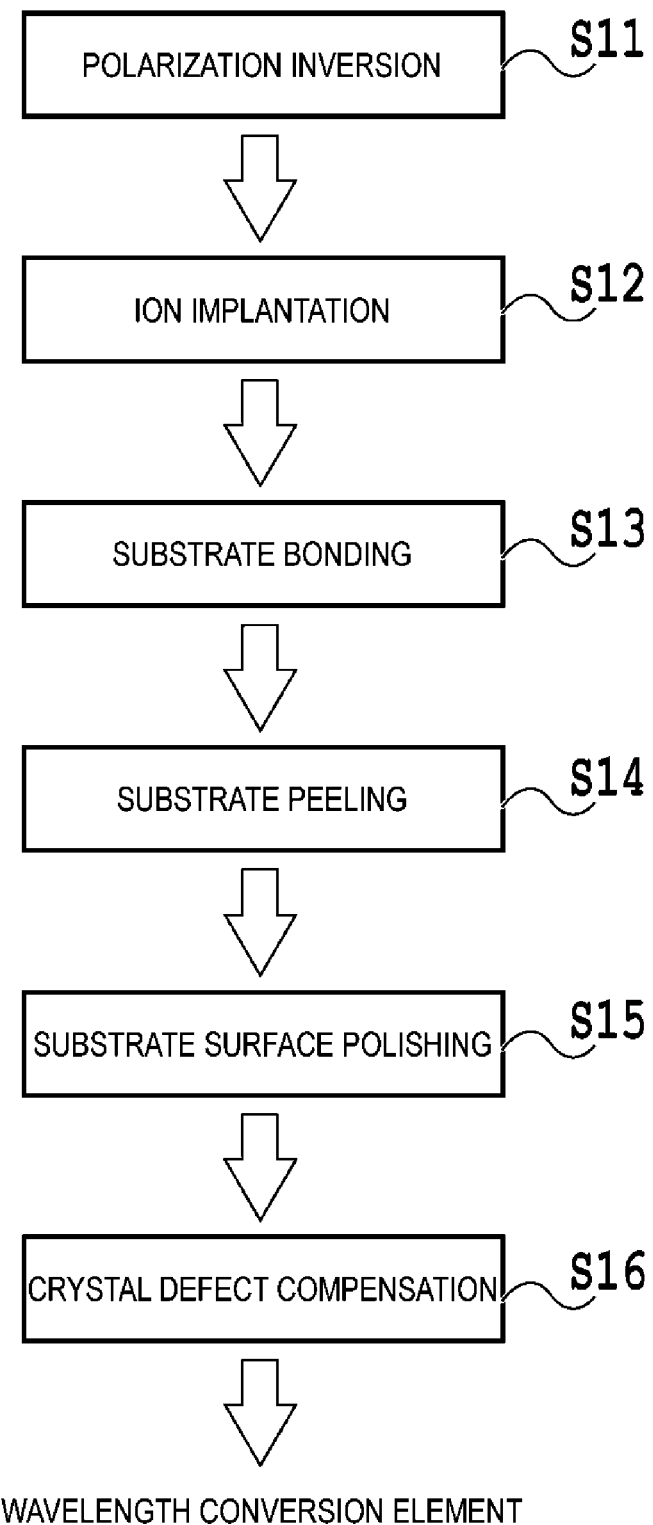
FIG. 3 is a flow chart illustrating a method for manufacturing the wavelength conversion element according to the present embodiment.

FIG. 3 is a flow chart illustrating a method for manufacturing the wavelength conversion element according to the present embodiment, and FIG. 4 is a diagram for describing steps. The method for manufacturing the wavelength conversion element according to the present embodiment will be described by using FIGS. 3 and 4.

First, in the method for manufacturing the wavelength conversion element according to the present embodiment, polarization inversion is provided to a second-order nonlinear optical crystal to form a periodic polarization inversion structure (S11). A first substrate 30 having the periodic polarization inversion structure 11 is obtained through a polarization inversion step of S11 (FIG. 4(a)).

In the polarization inversion step of S11, the periodic polarization inversion structure 11 is formed by controlling a spontaneous polarization direction of a crystal in a second-order nonlinear optical crystal substrate used as the first substrate 30 so to obtain a desired pattern for serving as a second-order nonlinear optical device. The spontaneous polarization direction is changed by applying an electric field at or below the Curie temperature of the crystal forming the substrate. Note that a material forming the first substrate may include a ferroelectric substance or a semiconductor having a second-order nonlinear optical effect such as lithium niobate, lithium tantalate, β-barium borate (BBO), potassium titanyl phosphate (KTP), and potassium tantalate niobate (KTN), or a compound obtained by adding an additive to these materials. The first substrate contains, for example, $LiNbO_3$, $KNbO_3$, $LiTaO_3$, $LiNb(x)Ta(1-x)O_3$ ($0 \leq x \leq 1$), or $KTiOPO_4$, or at least one selected from the group consisting of Mg, Zn, Sc, and In as an additive in addition to these.

In general, the spontaneous polarization in which the direction is controlled can be formed not only through application of an electric field but also through application of an electron beam. However, the method of applying an electric field has superior productivity compared to the method of applying an electron beam and is thus widely used.

Figure 5C:
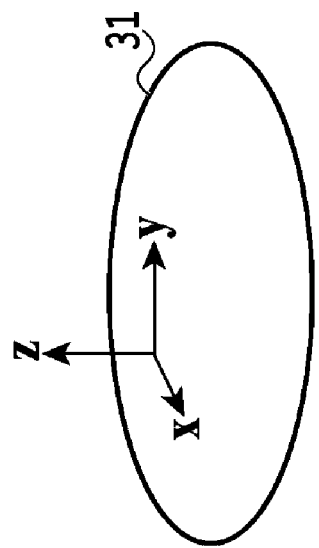
FIGS. 5(a)-5(c) are diagrams for describing a crystal orientation of a second-order nonlinear optical crystal.
Figure 5B:
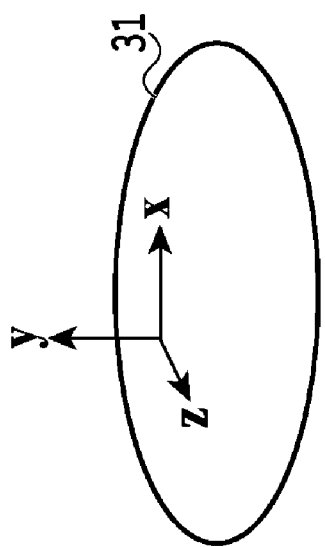
Figure 5A:
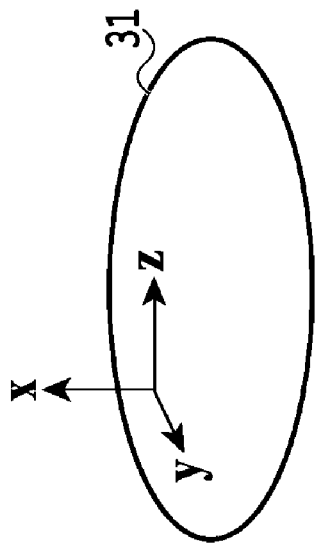
Figure 6B:
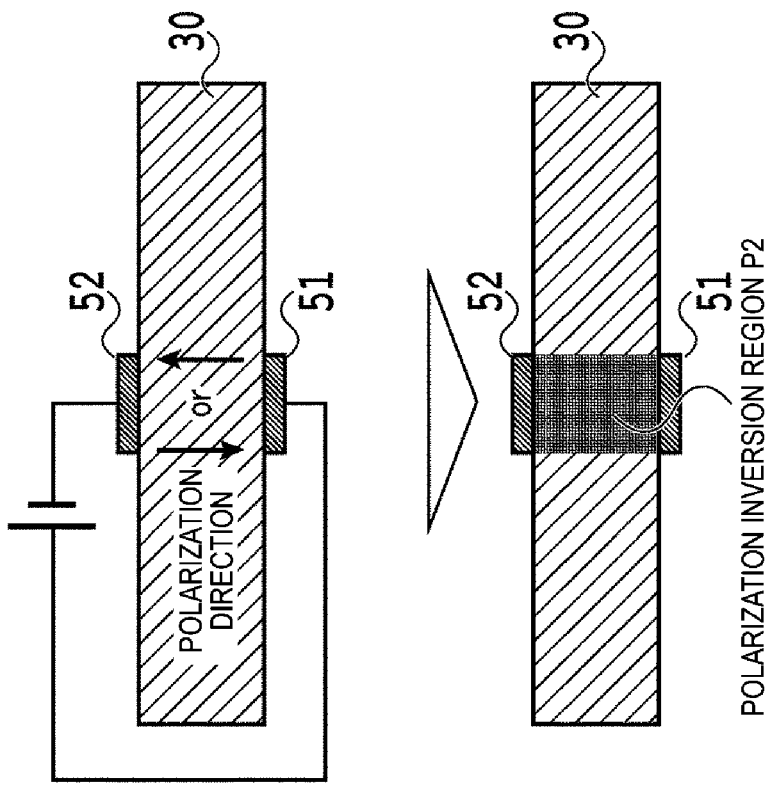
Figure 6A:
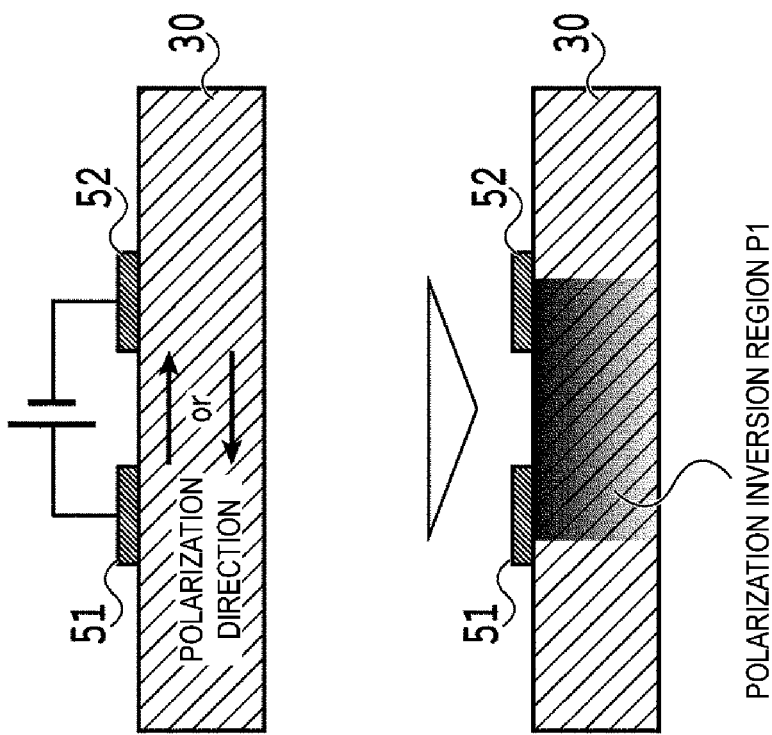
Figure 7:
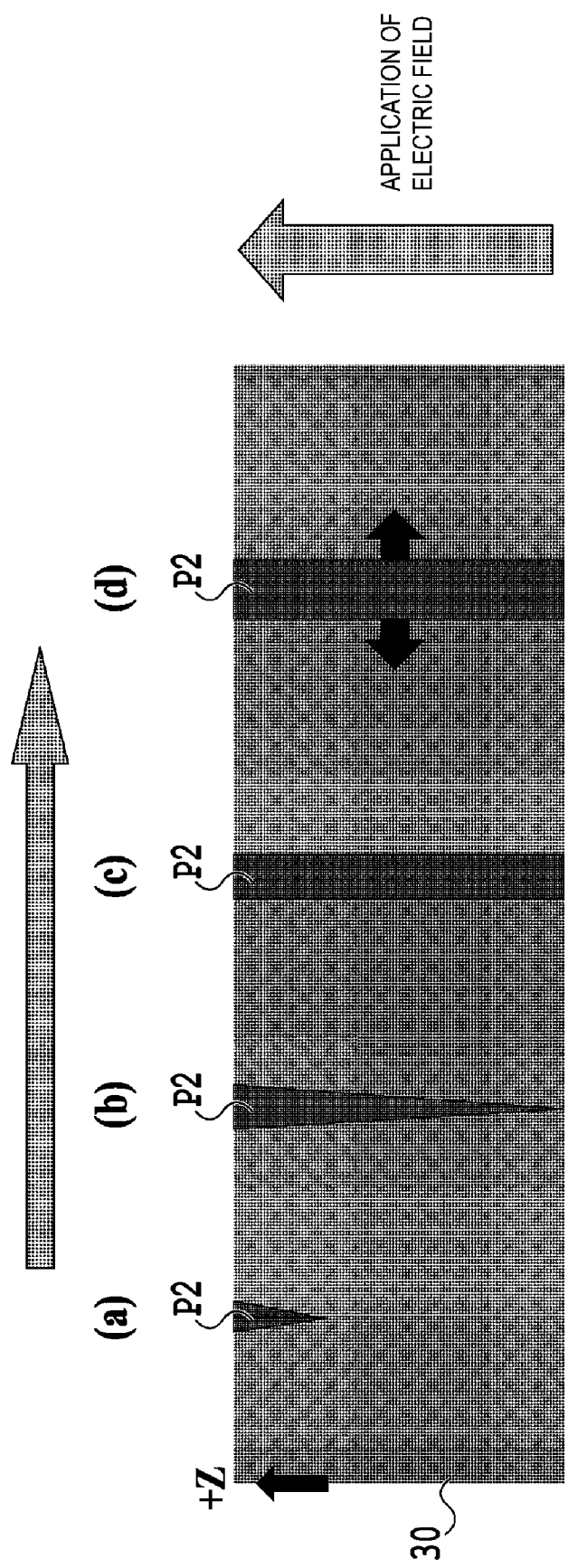
FIG. 7 is a diagram for describing a domain growth process of a polarization inversion region.

FIG. 5 is a diagram for describing a crystal orientation of a second-order nonlinear optical crystal. FIG. 5(a) illustrates an x-cut substrate plane 31, FIG. 5(b) illustrates a y-cut substrate plane 31, and FIG. 5(c) illustrates a z-cut substrate plane 31. FIG. 6 is a diagram for describing an electric field application procedure. FIGS. 6(a) and 6(b) illustrate a voltage application method and a polarization inversion region obtained by the voltage application method in an x-cut substrate and a z-cut substrate, respectively. FIG. 7 is a diagram for describing a domain growth process of the polarization inversion region. Here, the electric field application method of applying an electric field to form spontaneous polarization in which the direction is controlled will be further described.

The electric field application method includes roughly two types depending on a crystal direction of the substrate. A second-order nonlinear optical effect causing spontaneous polarization in a second-order nonlinear optical crystal is a characteristic that appears in a substance in which the centrosymmetry of the atomic arrangement is broken, and it can be said that the second-order nonlinear optical crystal includes a spatial axis (extraordinary ray axis) having a different refractive index from the other two axes. In the present specification, the spatial axis having a different refractive index from the other two axes is referred to as the z-axis, and in this case, a polarization direction of a medium is parallel to the z-axis. As illustrated in FIG. 6, the electric field application method is different between a case where a substrate plane includes the z-axis and a case where the substrate plane and the z-axis are orthogonal to each other. This is because a procedure for applying a strong electric field in the z-axis direction should be adopted in order to efficiently apply the electric field. Electrodes used for applying the electric field in the electric field application procedure may be liquid or solid. For example, a liquid electrode or a metal electrode may be used.

When the z-axis is included in the substrate plane 31 (FIG. 5(a): x-cut, FIG. 5(b): y-cut), electrodes 51 and 52 are formed on the same plane to apply a strong electric field to an axis parallel to a surface of the substrate 30, as illustrated in FIG. 6(a). In this procedure, the electric field increases in strength in an area closer to the surface of the substrate 30, and thus, a polarization inversion region p1 does not have a uniform pattern, and a patterning accuracy of the polarization inversion differs between a top surface and a bottom surface of the substrate.

When the substrate plane 31 is perpendicular to the z-axis (FIG. 5(c): z-cut), electrodes are formed on the top and bottom surfaces of the substrate, as illustrated in FIG. 6(b), and a strong electric field is applied in a direction perpendicular to the substrate 30. In this case, a domain growth process of a polarization inversion region p2 is illustrated in FIG. 7, and starts from a forming stage of the polarization inversion region p2 in (a), proceeds to a growth stage of the polarization inversion region p2 in (b), and then the polarization inversion region p2 reaches the bottom surface in (c). Furthermore, as illustrated in (d), a domain wall gradually moves to the left and right. That is, as illustrated in FIG. 7, in general, in the polarization inversion, the polarization inversion region that is the start region first elongates along the z-axis and forms a wider region after reaching the bottom surface, and thus, if the substrate plane is perpendicular to the z-axis, the polarization inversion region p2 has a uniform pattern, and thus, a uniform polarization inversion pattern is generated in the z-axis direction.

The manufacturing method according to the present embodiment is superior to methods in the known art in that a polarization-inverted substrate with good patterning accuracy can be obtained by performing polarization inversion on a single substrate that is not a composite substrate. In this respect, it is difficult to implement polarization inversion afterwards on a composite substrate in which a thin film substrate and a support substrate are already directly bonded.

The manufacturing method according to the present embodiment is more effective in the respect that a polarization-inverted substrate with good patterning accuracy can be obtained in a case where polarization inversion is performed on a z-cut substrate. However, even with an x-cut substrate or a y-cut substrate, the choice of composite substrates is greatly increased because no strong electric field is applied to a lower substrate. In the method where the polarization inversion is performed afterwards, the lower substrate inevitably needs to be a substrate that withstands the electric field during the polarization inversion. However, in the present manufacturing method in which the polarization inversion is performed first, the support substrate to be bonded may be susceptible to electric fields. With this method, a plurality of thin film LN layers having different polarization inversion patterns can be laminated in layers, and the range of optical design is widened.

Returning to FIG. 3, next, ions are implanted into the first substrate in which a periodic polarization inversion structure is formed (S12). The first substrate 30 formed with a damage layer 12 is obtained through an ion implantation step of S12 (FIG. 4(b)). In the ion implantation step of S12, the damage layer being a peeled surface in a later-described substrate peeling step can be formed by implanting, from one surface side of the substrate, helium, hydrogen ions, or lithium ions into the first substrate. The ions are implanted from the substrate surface under a controlled accelerating voltage and a controlled dose amount and trapped at a certain depth from the surface. It is desirable that the used ions are smaller than the atoms, such as hydrogen, helium, and lithium, forming the first substrate.

The first substrate 10 (FIG. 4(b)) for direct bonding is obtained through the two steps of S11 and S12 described above. Here, it is important that the first substrate for direct bonding can be obtained even if the order of the two steps (S11, S12) described above is reversed, and thus, in the method for manufacturing a wavelength conversion element according to the present embodiment, the order of the two steps does not matter. However, there is a difference depending on which of the two steps is executed first. For example, if the ion implantation step of S12 is performed prior to the polarization inversion step of S11, the temperature at which the ion implantation step is performed does not pose a problem, and the ions can be implanted deeply, and thus, this order is effective for manufacturing a thicker thin film. On the other hand, if the ion implantation step of S12 is performed after the polarization inversion step of S11, it is necessary to implant the ions at or below the Curie temperature so that the already formed polarization inversion pattern is not destroyed.

The first substrate 30 for direct bonding obtained through the steps (S11, S12) described above is directly bonded to the second substrate 20 serving as the support substrate (S13). In a substrate bonding step of S13, the first substrate 30 is directly bonded to the support substrate 20 on the surface on which the ions are implanted in the ion implantation step of S12 to obtain a composite substrate (FIG. 4(c)). As used herein, "direct bonding" means bonding of two substrates without a metal layer or a buffer layer therebetween, and is a concept including a bonding method using an adhesive. When an adhesive is used, it is preferable to select the type of adhesive according to the intended optical device. In a second-order nonlinear optical device, light having short wavelength and high intensity is guided in the device by second harmonic generation, and thus, bonding using an organic material that is susceptible to photo-degradation may not be desirable. In the case of direct bonding without an adhesive, the substrates may be bonded at high temperatures in order to increase the bonding strength, but in this case, a heat treatment must be performed at the Curie temperature of the second-order nonlinear optical crystal in order not to destroy the patterned polarization direction.

Next, the bonded substrates obtained in the substrate bonding step of S13 are subjected to heat treatment to peel the substrate with the damage layer in the substrate as a boundary to obtain a composite substrate in which the thin film substrate and the support substrate are laminated (S14). In order not to destroy the patterned polarization direction, the heat treatment temperature in the substrate peeling step of S14 needs to be at or below the Curie temperature of the second-order nonlinear optical crystal.

Furthermore, a substrate surface treatment step (S15) is performed to improve the performance as an optical substrate by polishing and smoothing the rough substrate peeled surface of the composite substrate. In general, as the surface structure of the waveguide is smoother, the performance as an optical substrate increases.

Furthermore, a crystal defect compensation step (S16) is performed to fill in a crystal defect generated in the steps from S11 to S15. A crystal defect usually occurs in a heat treatment step or the like and deteriorates the crystal quality. In the case of optical applications, it is desirable to eliminate crystal defects because such a defect may cause light scattering or light damage and reduce device performance.

In the crystal defect compensation step of S16, atoms are implanted to compensate for the crystal defect. Examples of the crystal defect compensation include crystal defect compensation by performing heat treatment (at or below the Curie temperature) in an atmosphere of atoms that fill defects such as oxygen atoms, and crystal defect compensation by implanting, from the substrate surface, atoms (lithium ions and oxygen ions in the case of lithium niobate) that fill defects under a specific accelerating voltage and a specific dose amount. The implanted atoms may be in an ionic state. In the crystal defect compensation using a heat treatment, the atoms enter from the surface of the substrate. However, in the crystal defect compensation using an atom implantation, it is possible to fill a crystal defect at a desired position within the crystal by gradually changing the accelerating voltage during the implantation.

The crystal quality of a composite substrate having a thin film substrate, being formed with a periodic polarization inversion structure so to realize the desired QPM, and being obtained by performing the steps S11 to S16 described above is hardly deteriorated and serves as the wavelength conversion element 1 having good quality (see FIG. 2). In particular, this method is an effective approach for obtaining a wavelength conversion element including a z-cut thin film substrate formed with a periodic polarization inversion structure that realizes a highly accurate QPM pattern.

Furthermore, in the method of manufacturing the wavelength conversion element according to the present embodiment, it is possible to reuse a part of the first substrate removed from the composite substrate after peeling the substrate, which is advantageous for obtaining a wavelength conversion element in which a plurality of thin film substrates are laminated. Although the crystal quality of a wafer surface after the substrate is peeled is poor, a reusable substrate with the polarization inversion structure can be secured by polishing, after the peeling, a part of the surface of the first substrate that is removed from the wavelength conversion element by the peeling. In this case, the polarization inversion step of S11 is omitted and the steps from the ion implantation step of S12 to the substrate peeling step of S14 are performed by using, instead of the first substrate, the reusable substrate with the polarization inversion structure, and thus, it is possible to secure a plurality of substrates with uniform crystal quality and uniform polarization inversion structures, as a result, this method is a preferred approach from the viewpoint of production efficiency and substrate quality. Of course, a substrate with a polarization inversion structure having different periods may be used as the reusable substrate with the polarization inversion structure.

In the method for manufacturing a wavelength conversion element according to the present embodiment, the periodic polarization inversion structure is formed and the first substrate on which the damage layer for the peeling is formed is directly bonded to the second substrate serving as the support substrate, and thus, the manufacturing method according to the present embodiment is a useful method not only in a case where the first substrate is a z-cut substrate, but also in a case where the first substrate is a substrate having another crystal orientation such as an x-cut substrate or a y-cut substrate. It is not necessary to apply a strong electric field to the second substrate being the support substrate of the thin film LN, and thus, there is an advantage in that a substrate to which no strong electric field can be applied can be selected as the support substrate. For example, the manufacturing method according to the present embodiment is effective in a case where a thin film crystal in which polarization is controlled is to be laminated on a semiconductor substrate on which a circuit is already formed. Furthermore, it is possible to laminate a plurality of thin film crystal substrates having different polarization inversion patterns through the manufacturing method according to the present embodiment, and thus, the possibilities of the optical design are greatly increased.

Examples in which the method for manufacturing a wavelength conversion element according to the present embodiment is specifically manufactured are described below.

Example 1

In this example, an aspect is employed in which the first substrate for bonding is obtained by performing the polarization inversion step of S11 and then performing the ion implantation step of S12.

The first substrate is a lithium niobate (LN) substrate having a surface subjected to an optical polishing process, and is a z-cut substrate cut so that the z-axis (extraordinary ray axis) is perpendicular to the substrate plane. Note that a material forming the present first substrate may be a ferroelectric material or a semiconductor having a second-order nonlinear optical effect such as lithium niobate, lithium tantalate, BBO, KTP, and KTN, or a compound obtained by adding an additive to these materials.

After the polarization direction of the first substrate was aligned in one direction, metal electrodes were formed on a substrate surface of the first substrate by a lift-off method to obtain a desired polarization inversion pattern. Subsequently, an electric field was applied to the metal electrodes to obtain the first substrate in which the polarization was inverted. The electrode used in the polarization inversion is not limited to the metal electrode, and may be a liquid electrode or the like.

Helium ions were implanted from one surface side of the LN substrate that was thoroughly cleaned after polarization inversion to produce a damage layer in the substrate. Note that the ions to be implanted may be hydrogen ions or lithium ions. The first substrate in which the damage layer was generated was cleaned thoroughly again and then directly bonded to the second substrate at a surface (the one surface side) close to the damage layer. In an optical device using a thin film substrate, the material forming the second substrate needs to be selected so that light is confined in the thin film substrate. The second substrate may be a substrate formed of a single material or may be a composite substrate having two or more layers.

A surface layer forming a bonding surface of the second substrate bonded to the first substrate was made of $SiO_2$ so that the refractive index was lower than that of the material forming the first substrate. It is only required that the material forming this surface is a material that is transparent to the light being used and has a lower refractive index than the first substrate, such as a dielectric material or a semiconductor including silicon, silicon dioxide, lithium niobate, indium phosphide, aluminum oxide, and polymers or a compound obtained by adding an additive to these materials. In the present example, a substrate having two layers formed by an LN support substrate layer of about 500 microns below a $SiO_2$ layer of 2 microns was used for the second substrate. It is desirable to manufacture the support substrate layer from a material having a thermal expansion coefficient similar to that of the first substrate. If the first substrate is made of LN, the material forming the support substrate layer may be lithium niobate, lithium tantalate, or a compound obtained by adding an additive to these materials.

After the first substrate was directly bonded to the second substrate, the substrate was exposed to a high temperature atmosphere by using an annealing furnace to peel the substrate. At this time, the temperature was set to a temperature equal to or lower than the Curie temperature of the material forming the first substrate so that the polarization inversion patterned on the first substrate is not broken.

The film thickness distribution of the thin film substrate after polarization inversion obtained after the peeling was measured, and as a result, it was possible to obtain a uniform thin film substrate with an average film thickness distribution of 700 nm in the plane. Furthermore, a CMP treatment was performed on the acquired thin film substrate, and thus, it was possible to obtain a surface smoothness sufficient for a substrate of a surface optical material. After the surface of the obtained substrate was wet-etched using nitrohydrofluoric acid, the polarization inversion pattern of the obtained substrate was inspected, and as a result, it was possible to confirm that the desired polarization inversion structure remained. By the present manufacturing technique, it was thus possible to obtain a wavelength conversion element in which a z-cut thin film substrate having a highly accurate polarization inversion structure is laminated to a support substrate.

The manufactured wavelength conversion element was subjected to heat treatment in an oxygen atmosphere to compensate for oxygen defects in the crystal generated during the substrate manufacturing process.

When the z-cut thin film substrate with the polarization inversion structure is formed into an optical waveguide structure if a region is provided in which polarization inversion is not provided on the first substrate, the problem of birefringence is solved in the optical waveguide formed in the region where polarization inversion is not provided.

Although the damage layer remains on the surface of a part of the first substrate removed by the peeling in the substrate peeling step, the first substrate includes a QPM pattern. After the damage layer on the surface of the substrate was removed by polishing the surface of the substrate with CMP polishing, helium ions were implanted again from the polished surface to form a damage layer in the substrate.

Furthermore, the substrate on which the damage layer was formed and a second substrate different from the second substrate mentioned above were attached to each other and peeling was performed by heat treatment to obtain a wavelength conversion element in which a z-cut thin film substrate with a new polarization inversion structure was laminated on a support substrate.

An evaluation of the new wavelength conversion element performed in the same manner as for the wavelength conversion element described above, indicated that it was possible to obtain a wavelength conversion element comparable to the substrate described above. This indicates that if this method is repeated, it is possible to obtain a wavelength conversion element in which a z-cut thin film substrate with a uniform polarization inversion structure and a support substrate are laminated.

When the damage layer is repeatedly generated and peeled, the first substrate with the QPM pattern is gradually thinned. Consequently, the method can be repeated as long as the first substrate is not damaged in any step. The number of repetitions depends on the initial thickness of the first substrate, the depth of the damage layer, and the amount of CMP for removing the damage layer. In the first substrate used this time, the substrate thickness is about 300 μm and the depth of the damage layer is about 700 nm during the manufacturing of the QPM pattern. Furthermore, the amount of CMP polishing for regenerating the surface of the first substrate was 200 to 300 nm.

Example 2

In this example, a substrate for bonding is obtained by performing the ion implantation step of S12 prior to the polarization inversion step of S11.

The first substrate used in the present example is a lithium niobate (LN) substrate having a surface subjected to an optical polishing process, and is a z-cut substrate cut so that the z-axis (extraordinary ray axis) is perpendicular to the substrate plane. Note that a material forming the present first substrate may be a ferroelectric material or a semiconductor having a second-order nonlinear optical effect such as lithium niobate, lithium tantalate, BBO, KTP, and KTN, or a compound obtained by adding an additive to these materials.

After the polarization direction of the first substrate was aligned in one direction, helium ions were implanted from the surface of the first substrate to form a damage layer inside the substrate. Note that the ions to be implanted may be hydrogen ions or lithium ions.

After the damage layer was generated in the substrate, metal electrodes were formed by a lift-off method on the substrate surface so to obtain a desired polarization inversion pattern. Subsequently, an electric field was applied to the metal electrodes to obtain the first substrate in which the polarization was inverted. The electrode used in the polarization inversion is not limited to the metal electrode, and may be a liquid electrode or the like.

The substrate on which the damage layer and the QPM pattern were formed was thoroughly washed again and then directly bonded to the second substrate. In an optical device using a thin film substrate, the material forming the second substrate needs to be selected so that light is confined in the first substrate that is formed into a thin film. The second substrate may be a substrate formed of a single material or may be a composite substrate having two or more layers.

A surface layer forming a bonding surface of the second substrate bonded to the first substrate was made of $SiO_2$ so that the refractive index was lower than that of the material forming the first substrate. It is only required that the material forming this surface is a material that is transparent to the light being used and has a lower refractive index than the first substrate, such as a dielectric material or a semiconductor including silicon, silicon dioxide, lithium niobate, indium phosphide, aluminum oxide, and polymers or a compound obtained by adding an additive to these materials. In the present example, a substrate having two layers formed by an LN support substrate layer of about 500 microns below a $SiO_2$ layer of 2 microns was used for the second substrate. It is desirable to manufacture the support substrate layer from a material having a thermal expansion coefficient similar to that of the first substrate. When the first substrate is made of LN, the support substrate may be lithium niobate, lithium tantalate, or a compound obtained by adding an additive to these materials.

After the first substrate and the second substrate were directly bonded, the substrate was exposed to a high temperature atmosphere by using an annealing furnace to peel the substrate. At this time, the temperature was set to a temperature equal to or lower than the Curie temperature of the material forming the first substrate so that the polarization inversion patterned on the first substrate is not broken.

The film thickness distribution of the substrate after polarization inversion obtained after the peeling was measured, and as a result, it was possible to obtain a uniform thin film substrate with an average film thickness distribution of 700 nm in the plane. Furthermore, a CMP treatment was performed on the acquired thin film substrate, and thus, it was possible to obtain a surface smoothness sufficient for a substrate of a surface optical material. After the surface of the obtained substrate was wet-etched using nitrohydrofluoric acid, the polarization inversion pattern of the obtained substrate was inspected, and as a result, it was possible to confirm that the desired polarization inversion structure remained. By the present manufacturing technique, it was thus possible to obtain a wavelength conversion element in which a z-cut thin film substrate having a highly accurate polarization inversion structure is laminated to a support substrate.

The manufactured substrate was subjected to heat treatment in an oxygen atmosphere to compensate for oxygen defects in the crystal generated during the substrate manufacturing process.

Example 3

In this example, a wavelength conversion element having a structure in which, as the first substrate, a plurality of LN layers having polarization inversion structures with different QPM patterns (periods) are laminated in layers as the thin film substrate is manufactured.

The first substrate is a lithium niobate (LN) substrate having a surface subjected to an optical polishing process, and is an x-cut substrate cut so that the x-axis (ordinary optical axis) is perpendicular to the substrate plane. Note that the crystal orientation of the substrate may be y-cut, z-cut, or the like. A material forming the first substrate may be a ferroelectric material or a semiconductor having a second-order nonlinear optical effect such as lithium niobate, lithium tantalate, BBO, KTP, and KTN, or a compound obtained by adding an additive to these materials.

After the polarization direction of the first substrate was aligned in one direction, metal electrodes were formed on a substrate surface of the first substrate by a lift-off method to obtain a desired polarization inversion pattern. Subsequently, an electric field was applied to the metal electrodes to obtain the first substrate in which the polarization was inverted. The electrode used in the polarization inversion is not limited to the metal electrode, and may be a liquid electrode or the like.

Helium ions were implanted from one surface side of the LN substrate that was thoroughly cleaned after polarization inversion to produce a damage layer in the substrate. Note that the ions to be implanted may be hydrogen ions or lithium ions. The substrate on which the damage layer was formed was thoroughly washed again and then directly bonded to the second substrate. In an optical device using a thin film substrate, the material forming the second substrate needs to be selected so that light is confined in the first substrate that is formed into a thin film. The second substrate may be a substrate formed of a single material or may be a composite substrate having two or more layers. A surface layer forming a bonding surface of the second substrate bonded to the first substrate was made of $SiO_2$ so that the refractive index was lower than that of the material forming the first substrate. It is only required that the material forming this surface is a material that is transparent to the light being used and has a lower refractive index than the first substrate, such as a dielectric material or a semiconductor including silicon, silicon dioxide, lithium niobate, indium phosphide, aluminum oxide, and polymers or a compound obtained by adding an additive to these materials. In the present example, a substrate having two layers formed by an LN support substrate layer of about 500 microns below a $SiO_2$ layer of 2 microns was used for the second substrate. It is desirable to manufacture the support substrate layer from a material having a thermal expansion coefficient similar to that of the first substrate. When the first substrate is made of LN, the support substrate may be lithium niobate, lithium tantalate, or a compound obtained by adding an additive to these materials.

After the first substrate and the second substrate were directly bonded, the substrate was exposed to a high temperature atmosphere by using an annealing furnace to peel a part of the first substrate from the composite substrate. At this time, the temperature was set to a temperature equal to or lower than the Curie temperature of the material forming the first substrate so that the polarization inversion patterned on the first substrate is not broken.

After the peeling, a CMP treatment was performed on the substrate surface.

Subsequently, helium ions were implanted from a surface of a third substrate having a second-order nonlinear optical effect in which polarization inversion is controlled to form a damage layer in the substrate. Note that the third substrate is a substrate having a periodic polarization inversion structure with a period different from that of the first substrate. Furthermore, the third substrate may have any crystal orientation, and it is not necessary that the material forming the third substrate is the same as that of the first substrate. In the present example, an x-cut LN substrate having a polarization inversion structure with a period different from that of the first substrate was employed for the third substrate.

The third substrate on which the damage layer was formed was thoroughly washed again and then directly bonded onto the thin film substrate of the composite substrate. After the first substrate and the third substrate were directly bonded, the substrate was exposed to a high temperature atmosphere by using an annealing furnace to peel a part of the third substrate from the composite substrate. At this time, the part of the third substrate was peeled at or below the Curie temperature of the materials forming the first substrate and the third substrate so that the polarization inversion patterned on the first substrate and the third substrate was not damaged. As a result, it was possible to laminate two thin film substrates with different polarization inversion patterns. By repeating the present method, it is possible to realize a laminated structure having two or more layers.

REFERENCE SIGNS LIST

1 Wavelength conversion element
10 Thin film substrate
11 Periodic polarization inversion structure
20 Second substrate, Support substrate
30 First substrate
31 Substrate plane
40 Part of first substrate
51, 52 Electrode

The invention claimed is:

1. A method of manufacturing a wavelength conversion element, comprising:
a bonding substrate formation step of forming a periodic polarization inversion structure on a first substrate made of a second-order nonlinear optical crystal and forming a damage layer in the first substrate by implanting ions from one substrate surface to obtain a first substrate for bonding;
a bonding step of directly bonding a second substrate having a bonding surface having a smaller refractive index than a refractive index of the first substrate to the one substrate surface of the first substrate at the bonding surface; and
a substrate peeling step of peeling the first substrate directly bonded to the second substrate being a support substrate with the damage layer as a boundary to remove a part of the first substrate to obtain a wavelength conversion element in which an ultrathin thin film substrate is directly bonded onto the support substrate,
wherein the first substrate is a substrate cut so that only an axis having a different refractive index runs along a direction perpendicular to a substrate surface.

2. The method of manufacturing a wavelength conversion element according to claim 1, wherein, in the bonding substrate formation step, the damage layer is formed after the periodic polarization inversion structure is formed.

3. The method of manufacturing a wavelength conversion element according to claim 1, wherein, in the bonding substrate formation step, the periodic polarization inversion structure is formed after the damage layer is formed.

4. The method of manufacturing a wavelength conversion element according to claim 1, further comprising: a bonding substrate reformation step of polishing a surface of the part of the first substrate removed by the peeling in the substrate peeling step, and forming a damage layer in a substrate of the part of the first substrate by implanting ions from one substrate surface to obtain a third substrate for bonding; and a thin film substrate laminating step of further performing the bonding step and the substrate peeling step by using the third substrate instead of the first substrate after the bonding substrate reformation step.

5. The method of manufacturing a wavelength conversion element according to claim 1, wherein, in the bonding substrate formation step, the periodic polarization inversion structure is formed only in a part of the first substrate.

6. The method of manufacturing a wavelength conversion element according to claim 1, wherein the first substrate contains $LiNbO_3$, $KNbO_3$, $LiTaO_3$, $LiNb(x)Ta(1-x)O_3$ ($0 \leq x \leq 0$), or $KTiOPO_4$, or at least one selected from the group consisting of Mg, Zn, Sc, and In as an additive in addition to $LiNbO_3$, $KNbO_3$, $LiTaO_3$, $LiNb(x)Ta(1-x)O_3$ ($0 \leq x \leq 1$), or $KTiOPO_4$.

7. The method of manufacturing a wavelength conversion element according to claim 1, wherein, in the bonding substrate formation step, the ions implanted to form the damage layer are ions of atoms smaller than atoms forming the first substrate.

8. A method of manufacturing a wavelength conversion element, comprising:
a bonding substrate formation step of forming a periodic polarization inversion structure on a first substrate made of a second-order nonlinear optical crystal and forming a damage layer in the first substrate by implanting ions from one substrate surface to obtain a first substrate for bonding;
a bonding step of directly bonding a second substrate having a bonding surface having a smaller refractive index than a refractive index of the first substrate to the one substrate surface of the first substrate at the bonding surface;
a substrate peeling step of peeling the first substrate directly bonded to the second substrate being a support substrate with the damage layer as a boundary to remove a part of the first substrate to obtain a wavelength conversion element in which an ultrathin thin film substrate is directly bonded onto the support substrate; and
at least one of a substrate surface treatment step of polishing a surface of the ultrathin thin film substrate after the substrate peeling step to smooth the ultrathin thin film substrate, and a crystal defect compensation step of implanting atoms for compensating for a crystal defect into the ultrathin thin film substrate after the substrate peeling step.

9. The method of manufacturing a wavelength conversion element according to claim 8, wherein, in the bonding substrate formation step, the damage layer is formed after the periodic polarization inversion structure is formed.

10. The method of manufacturing a wavelength conversion element according to claim 8, wherein, in the bonding substrate formation step, the periodic polarization inversion structure is formed after the damage layer is formed.

11. The method of manufacturing a wavelength conversion element according to claim 8, wherein, in the bonding substrate formation step, the periodic polarization inversion structure is formed only in a part of the first substrate.

12. The method of manufacturing a wavelength conversion element according to claim 8, wherein the first substrate contains $LiNbO_3$, $KNbO_3$, $LiTaO_3$, $LiNb(x)Ta(1-x)O_3$ ($0 \leq x \leq 1$), or $KTiOPO_4$, or at least one selected from the group consisting of Mg, Zn, Sc, and In as an additive in addition to $LiNbO_3$, $KNbO_3$, $LiTaO_3$, $LiNb(x)Ta(1-x)O_3$ ($0 \leq x \leq 1$), or $KTiOPO_4$.

13. The method of manufacturing a wavelength conversion element according to claim 8, wherein, in the bonding substrate formation step, the ions implanted to form the damage layer are ions of atoms smaller than atoms forming the first substrate.

* * * * *